United States Patent
Caldwell et al.

(10) Patent No.: US 7,256,595 B2
(45) Date of Patent: Aug. 14, 2007

(54) TEST SOCKETS, TEST SYSTEMS, AND METHODS FOR TESTING MICROFEATURE DEVICES

(75) Inventors: John L. Caldwell, Meridian, ID (US); Mark A. Tverdy, Boise, ID (US); Michael R. Slaughter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 10/805,872

(22) Filed: Mar. 22, 2004

(65) Prior Publication Data

US 2005/0206401 A1    Sep. 22, 2005

(51) Int. Cl.
G01R 31/02    (2006.01)

(52) U.S. Cl. .................................................... 324/757

(58) Field of Classification Search ............... 324/755, 324/754, 765; 439/66, 68, 482; 29/884, 29/825, 830, 846, 874
See application file for complete search history.

(56) References Cited

U.S. PATENT DOCUMENTS

| | | |
|---|---|---|
| 5,739,050 A | 4/1998 | Farnworth |
| 5,815,000 A | 9/1998 | Farnworth et al. |
| 5,894,218 A | 4/1999 | Farnworth et al. |
| 6,018,249 A | 1/2000 | Akram et al. |
| 6,025,728 A | 2/2000 | Hembree et al. |
| 6,048,744 A | 4/2000 | Corisis et al. |
| 6,072,323 A | 6/2000 | Hembree et al. |
| 6,081,429 A | 6/2000 | Barrett |
| 6,094,058 A | 7/2000 | Hembree et al. |
| 6,107,122 A | 8/2000 | Wood et al. |
| 6,150,717 A | 11/2000 | Wood et al. |
| 6,163,956 A | 12/2000 | Corisis |
| 6,188,232 B1 | 2/2001 | Akram et al. |
| 6,198,172 B1 | 3/2001 | King et al. |
| 6,208,155 B1 * | 3/2001 | Barabi et al. ............... 324/754 |
| 6,208,156 B1 | 3/2001 | Hembree |
| 6,247,629 B1 | 6/2001 | Jacobson et al. |
| 6,255,833 B1 | 7/2001 | Akram et al. |
| 6,285,204 B1 | 9/2001 | Farnworth |
| 6,294,839 B1 | 9/2001 | Mess et al. |
| 6,373,273 B2 * | 4/2002 | Akram et al. ............... 324/765 |
| 6,400,169 B1 * | 6/2002 | Hembree ..................... 324/755 |
| 6,437,586 B1 | 8/2002 | Robinson |
| 6,529,027 B1 * | 3/2003 | Akram et al. ............... 324/758 |
| 6,677,770 B2 * | 1/2004 | Frankowsky ................ 324/755 |
| 6,707,309 B2 * | 3/2004 | Sato et al. .................. 324/755 |
| 6,757,972 B1 * | 7/2004 | Farnworth ..................... 29/884 |
| 7,093,358 B2 * | 8/2006 | Akram et al. ............... 324/758 |

(Continued)

Primary Examiner—Jermele Hollington
(74) Attorney, Agent, or Firm—Perkins Coie LLP

(57) ABSTRACT

Test sockets, test systems, and methods for testing microfeature devices with a substrate and a plurality of conductive interconnect elements projecting from the substrate. In one embodiment, a test socket includes a support surface and a plurality of apertures in the support surface corresponding to at least some of the interconnect elements of the microfeature device. The individual apertures extend through the test socket and are sized to receive a portion of one of the interconnect elements so that the substrate is spaced apart from the support surface when the microfeature device is received in the test socket. In one aspect of this embodiment, the individual apertures have a cross-sectional dimension less than a cross-sectional dimension of the interconnect elements so that the apertures receive only a portion of the corresponding interconnect element.

21 Claims, 5 Drawing Sheets

U.S. PATENT DOCUMENTS

| | | |
|---|---|---|
| 7,101,209 B2* | 9/2006 | Yates et al. .................. 324/754 |
| 2003/0141885 A1* | 7/2003 | Akram et al. ................ 324/754 |
| 2004/0021477 A1* | 2/2004 | Tay et al. .................... 324/755 |
| 2005/0162152 A1* | 7/2005 | Yates ....................... 324/158.1 |
| 2006/0170412 A1* | 8/2006 | Park et al. ................. 324/158.1 |
| 2006/0197544 A1* | 9/2006 | Caldwell et al. ............. 324/757 |
| 2006/0197545 A1* | 9/2006 | Caldwell et al. ............. 324/757 |

* cited by examiner

TEST SOCKETS, TEST SYSTEMS, AND METHODS FOR TESTING MICROFEATURE DEVICES

TECHNICAL FIELD

The present invention is related to test sockets, test systems, and methods for testing microfeature devices.

BACKGROUND

Conventional microelectronic devices are manufactured for specific performance characteristics required for use in a wide range of electronic equipment. A microelectronic bare die, for example, includes an integrated circuit and a plurality of bond-pads and/or redistribution layer (RDL) pads electrically coupled to the integrated circuit. The bond-pads can be arranged in an array, and a plurality of solder balls can be attached to corresponding bond-pads to construct a "ball-grid array." Conventional bare dies with ball-grid arrays generally have solder balls arranged, for example, in 6×9, 6×10, 6×12, 6×15, 6×16, 8×12, 8×14, or 8×16 patterns, but other patterns are also used. Many bare dies with different circuitry can have the same ball-grid array but different outer profiles.

Bare dies are generally tested in a post-production batch process to determine which dies are defective. In one conventional test process, several bare dies are placed in corresponding test sockets of a test tray. FIG. 1 is a schematic side cross-sectional view of a typical test socket 20 carrying a bare die 60 in accordance with the prior art. The test socket 20 includes a body 22 having a recess 24 and a shelf 34 in the recess 24. The shelf 34 supports an outer perimeter region of the bare die 60, and solder balls 68 on the die 60 are positioned within an opening 36 defined by the shelf 34. The test socket 20 is movable relative to a tester interface 90 so that contacts 92 on the tester interface 90 can apply electrical signals to corresponding solder balls 68 for testing the bare die 60.

One problem with conventional test sockets is that debris can accumulate within the sockets, which damages and contaminates the bare dies. More specifically, particles and contaminants from other processes, such as chemical-mechanical planarization, vapor deposition, etc., may be carried to the test socket 20 on the bare dies. This debris can accumulate in the test socket and eventually scratch, impinge, pierce, contaminate and/or otherwise damage subsequent bare dies. For example, during processing, the test socket 20 illustrated in FIG. 1 can collect debris on the shelf 34, and when a bare die is placed into the socket 20, the debris can puncture the soft, protective coating on the surface of the die and damage its internal circuitry.

Another problem with conventional test sockets is that the solder balls may not be aligned with the test contacts. More specifically, if the profile of a bare die is slightly out of tolerance, the solder balls on the die may not align with the test contacts. In the test socket 20 of FIG. 1, for example, the die 60 is aligned with the tester interface 90 by positioning ends 65 of the die 60 against side surfaces 27 of the socket 20. As such, if the profile of the die 60 is out of specification, such as if the length L of the die 60 is too short, the solder balls 68 may not be aligned with the test contacts 92 and the die 60 may fail the test even though the die 60 otherwise functions properly.

Another drawback of conventional test sockets is that the sockets limit the space available on bare dies for ball-grid arrays. For example, because the shelf 34 of the test socket 20 of FIG. 1 supports the outer perimeter region of the die 60, the outer solder balls 68a must be spaced inward at least a distance S from the corresponding ends 65 of the die 60. The reduced area for solder balls is a significant problem on bare dies with small profiles or high solder ball counts.

Accordingly, there is a need for an improved test socket for carrying bare dies and other microelectronic devices.

BRIEF DESCRIPTION OF THE DRAWINGS

FIG. 5A is a schematic side cross-sectional view of a test socket having a plurality of cylindrical apertures in accordance with another embodiment of the invention.

FIG. 5B is a schematic side cross-sectional view of a test socket having a plurality of apertures in accordance with another embodiment of the invention.

FIG. 5C is a schematic side cross-sectional view of a test socket having a plurality of apertures in accordance with another embodiment of the invention.

FIG. 6A is a top plan view of a support surface of the test socket illustrated in FIGS. 3A and 3B.

FIG. 6B is a top plan view of a support surface of a test socket in accordance with another embodiment of the invention.

FIG. 6C is a top plan view of a support surface of a test socket in accordance with another embodiment of the invention.

DETAILED DESCRIPTION

A. Overview

Figure 1:
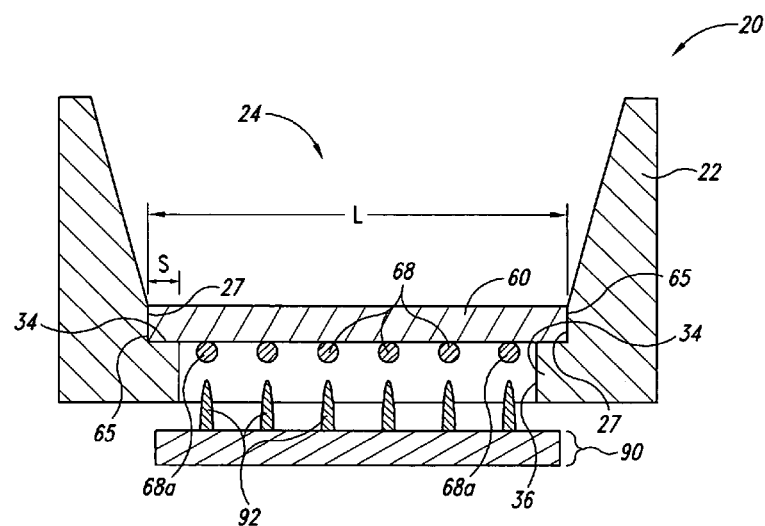
FIG. 1 is a schematic side cross-sectional view of a test socket carrying a bare die in accordance with the prior art.

The present invention is directed toward test sockets, test systems, and methods for testing microfeature devices. The term "microfeature device" is used throughout to include microelectronic devices, micromechanical devices, data storage elements, read/write components, and other articles of manufacture. For example, microfeature devices include SIMM, DRAM, Flash-Memory, ASICS, processors, flip chips, ball-grid array chips, and other types of microelectronic devices or components. Several specific details of the invention are set forth in the following description and in FIGS. 2-6C to provide a thorough understanding of certain embodiments of the invention. One skilled in the art, however, will understand that the present invention may have additional embodiments or that embodiments of the invention may be practiced without several of the specific features described below.

Several aspects of the invention are directed to test sockets for receiving a microfeature device having a substrate and a plurality of conductive interconnect elements projecting from the substrate. The interconnect elements, for example, can be solder balls or other types of conductive balls. In one embodiment, a test socket includes a support surface and a plurality of apertures in the support surface corresponding to at least some of the interconnect elements on the microfeature device. The apertures extend through the test socket and are sized to receive a portion of one of the interconnect elements so that the substrate is spaced apart from the support surface when the microfeature device is received in the test socket. In one aspect of this embodiment, the apertures have a cross-sectional dimension less than the cross-sectional dimension of the interconnect elements so that the apertures receive only a portion of corresponding interconnect elements.

The apertures in the support surface can have numerous configurations. For example, the apertures can be arranged in rows and columns corresponding to an array of conductive balls on the microfeature device. Alternatively, the support surface can include an opening, and the apertures can be arranged around the perimeter of the opening. In this arrangement, when the microfeature device is received in the test socket, the apertures receive corresponding interconnect elements and the other interconnect elements are positioned at the opening. In any of these arrangements, the individual apertures can include a first beveled portion proximate to the support surface and/or a second beveled portion proximate to an exterior surface of the test socket.

Another aspect of the invention is directed to systems for testing microfeature devices. In one embodiment, a system includes a test tray having a plurality of test sockets to support a plurality of microfeature devices and a tester interface movable relative to the test tray to test the microfeature devices. The individual test sockets include a support surface and an array of apertures in the support surface arranged to receive corresponding interconnect elements of the microfeature device. The individual apertures extend through the test socket and have a cross-sectional dimension less than a cross-sectional dimension of the corresponding interconnect element so that the substrate is spaced apart from the support surface when the microfeature device is received in the test socket. The tester interface includes a plurality of test contact arrays, and the individual test contact arrays are aligned to selectively contact a corresponding interconnect element array.

Another aspect of the invention is directed to methods of testing a microfeature device. In one embodiment, a method includes positioning several of the interconnect elements on the microfeature device partially within corresponding apertures in a support surface of a test socket so that the substrate is spaced apart from the support surface. The method further includes contacting the interconnect elements with corresponding test contacts to test the microfeature device while the microfeature device is received within the test socket.

B. Embodiments of Systems for Testing Microfeature Devices

Figure 2:
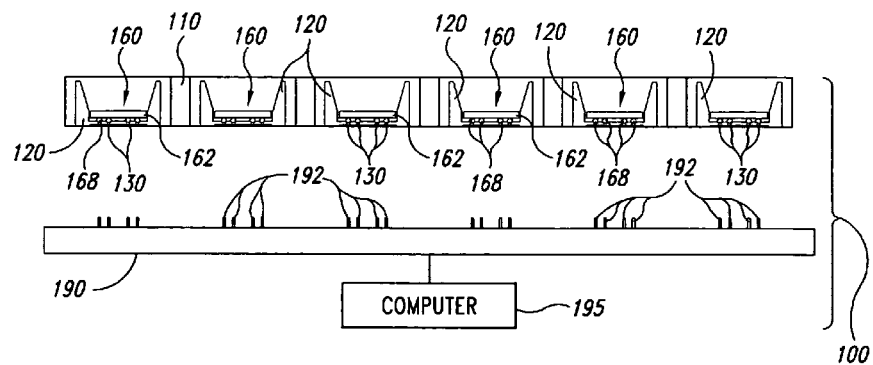
FIG. 2 is a schematic side cross-sectional view of a system for testing a plurality of microfeature devices in accordance with one embodiment of the invention.

FIG. 2 is a schematic side cross-sectional view of a system 100 for testing a plurality of microfeature devices 160 in accordance with one embodiment of the invention. The individual microfeature devices 160 can be singulated bare dies or other devices having a substrate 162 and a plurality of solder balls 168 or other conductive interconnect elements projecting from the substrate 162. The system 100 can test the microfeature devices 160 individually or in a batch process to ensure and verify that the devices 160 function according to specification.

The illustrated system 100 includes a test tray 110 and a plurality of test sockets 120 carried by the test tray 110, which in turn carry corresponding microfeature devices 160. The individual test sockets 120 include an array of apertures 130 corresponding to the array of solder balls 168 on the microfeature device 160, as described in greater detail below. The illustrated system further includes a tester interface 190 having a plurality of test contacts 192 arranged in arrays corresponding to the arrays of solder balls 168 on the respective microfeature devices 160 in the test tray 110. The test tray 110 is movable relative to the tester interface 190 to insert the test contacts 192 into corresponding apertures 130 so that the test contacts 192 can apply electrical signals to respective solder balls 168 and test the microfeature devices 160. The system 100 also includes a computer 195 operatively coupled to the tester interface 190. The computer 195 sends/receives signals from the microfeature devices 160 via the tester interface 190.

C. Embodiments of Test Sockets for Carrying Microfeature Devices

Figure 3A:
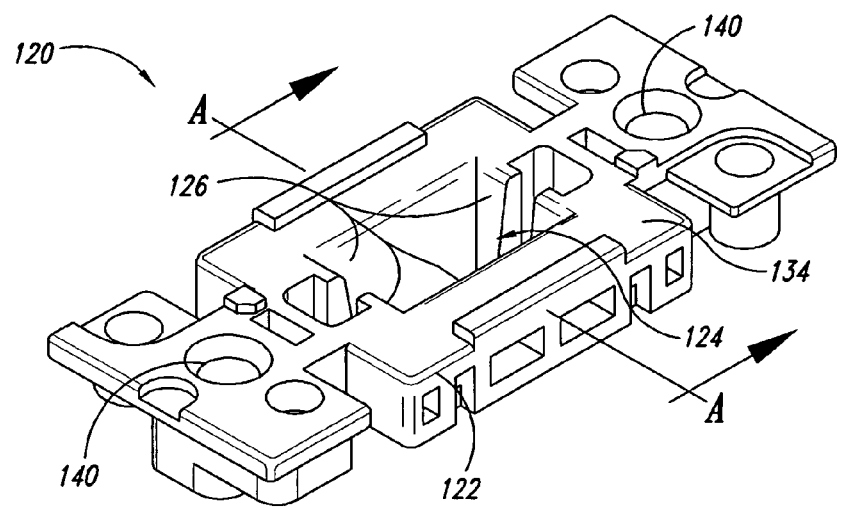
FIG. 3A is an isometric view of one of the test sockets of FIG. 2.
Figure 3B:
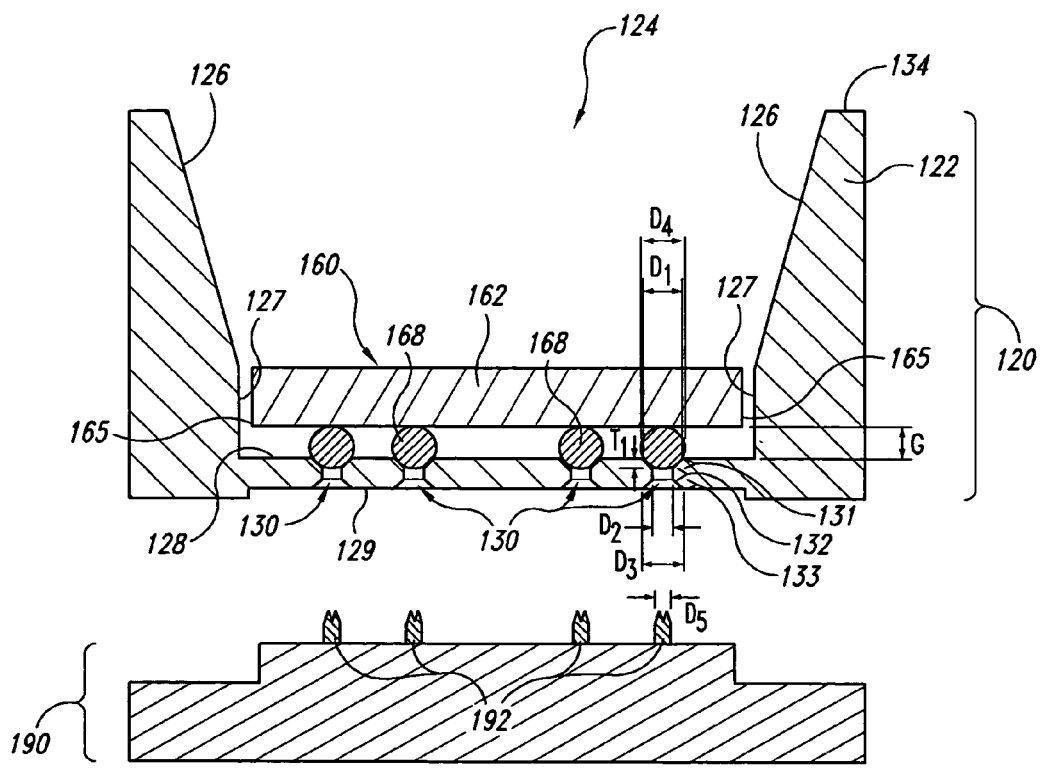
FIG. 3B is a side cross-sectional view of the test socket of FIG. 3A taken substantially along the line A-A.

FIG. 3A is an isometric view of one of the test sockets 120 of FIG. 2, and FIG. 3B is a side cross-sectional view of the test socket 120 of FIG. 3A taken substantially along the line A-A. Referring to FIG. 3A, the illustrated test socket 120 includes a plurality of alignment features 140 to properly position the test socket 120 and the microfeature device 160 relative to the tester interface 190 (FIG. 2). In the illustrated embodiment, the alignment features 140 are holes through which alignment pins can slide as the test socket 120 moves toward the tester interface 190.

Referring to FIGS. 3A and 3B together, the illustrated test socket 120 further includes a body 122 having a plurality of lead-in surfaces 126, a plurality of side surfaces 127 (FIG. 3B) connected to corresponding lead-in surfaces 126, and a support surface 128 (FIG. 3B) extending between the side surfaces 127. The lead-in surfaces 126, side surfaces 127, and support surface 128 define a recess 124 for receiving one of the microfeature devices 160 (FIG. 3B). The lead-in surfaces 126 taper inwardly from a top surface 134 to the side surfaces 127 to align the microfeature device 160 in the test socket 120. In other embodiments, the body 122 of the test socket 120 can have other configurations that may not include four lead-in surfaces 126 and/or four side surfaces 127. For example, the body 122 can include one tapered lead-in surface extending from the top surface 134 to the support surface 128 and three non-tapered side surfaces extending from the top surface 134 to the support surface 128.

Referring only to FIG. 3B, the illustrated support surface 128 includes a plurality of apertures 130 arranged in an array corresponding to the array of solder balls 168 on the microfeature device 160. The individual apertures 130 extend through the test socket 120 and are sized to receive only a distal portion of a corresponding solder ball 168 so that the substrate 162 is spaced apart from the support surface 128 by a gap G. The size and configuration of the apertures 130 are dependent upon the gap G distance, solder ball size, test contact size, and/or other parameters. For example, in the illustrated embodiment, the individual apertures 130 include a beveled first portion 131 having a first diameter $D_1$ proximate to the support surface 128, a second portion 132 having a second diameter $D_2$, and a beveled third portion 133 having a third diameter $D_3$ at an exterior surface 129. The first diameter $D_1$ can be greater than or less than a corresponding diameter $D_4$ of the solder balls 168. The second diameter $D_2$ is less than the diameter $D_4$ of the solder balls 168 so that only a portion of each individual solder ball 168 is received within the corresponding aperture 130. The second diameter $D_2$, however, is greater than a diameter $D_5$ of the individual test contacts 192 so that the test contacts 192 can be inserted into corresponding apertures 130 and contact the respective solder balls 168.

For purposes of illustration, in one embodiment, the second diameter $D_2$ of the apertures 130 can be from approximately 70 percent to approximately 80 percent of the diameter $D_4$ of the solder balls 168. In one aspect of this embodiment in which the solder balls 168 have a diameter $D_4$ of approximately 0.45 mm, the second diameter $D_2$ of the apertures 130 can be approximately 0.35 mm or approximately 78 percent of the diameter $D_4$ of the solder balls 168. In other embodiments, the second diameter $D_2$ of the apertures 130 can be greater than 80 percent or less than 70 percent of the diameter $D_4$ of the solder balls 168. In additional embodiments, such as those described below with reference to FIGS. 4-5C, individual apertures can have other configurations and/or sizes to receive a portion of the corresponding solder ball. In any of these embodiments, however, the apertures have a cross-sectional dimension that is smaller than a cross-sectional dimension of the corresponding solder ball or interconnect element so that the substrate is spaced apart from the support surface.

One feature of the test socket 120 shown in FIG. 3B is that the individual apertures 130 are sized and configured to receive only the distal portions of corresponding solder balls 168 so that the substrate 162 is spaced apart from the support surface 128 by the gap G. The substrate 162 is accordingly less likely to be contaminated or damaged by debris accumulated on the support surface 128 of the test socket 120. For example, in some embodiments, such as when the microfeature device 160 is a bare die, the device 160 may have only a thin, soft protective coating over the internal components. In these embodiments, if the substrate 162 were to contact the support surface 128, the debris could pierce the protective coating and damage the microfeature device 160. The illustrated test socket 120 accordingly reduces the likelihood that microfeature devices 160 will be damaged and/or contaminated because the substrates 162 do not contact the support surface 128.

Another feature of the illustrated test socket 120 is that the microfeature device 160 is aligned with the tester interface 190 by placing the solder balls 168 partially within the corresponding apertures 130. An advantage of this feature is that the microfeature device 160 is properly aligned with the tester interface 190 even if the profile of the substrate 162 is out of specification because the alignment of the device 160 is based on the solder balls 168 instead of the profile of the substrate 162. In contrast, the prior art device 60 illustrated in FIG. 1 is aligned with the tester interface 90 by positioning the ends 65 of the device 60 against or within the side surfaces 27 of the test socket 20. Accordingly, if the profile of the device 60 is out of specification, the solder balls 68 may not align with the test contacts 92.

Another feature of the illustrated test socket 120 is that the space on the microfeature device 160 available for solder balls 168 is not limited by the socket 120. Because the substrate 162 is spaced apart from the support surface 128, the solder balls 168 can be attached to the substrate 162 proximate to the ends 165 of the device 160. An advantage of this feature is that the profile of the substrate 162 can be reduced and/or the solder ball count or size can be increased. In contrast, the prior art test socket 20 illustrated in FIG. 1 limits the space available on the device 60 for solder balls 68 because a perimeter region of the device 60 must rest upon the shelf 65.

Another feature of the illustrated test socket 120 is that the support surface 128 and the exterior surface 129 are generally flat and the apertures 130 include beveled portions 131 and 133. An advantage of this feature is that the flat surfaces 128 and 129 allow misaligned solder balls 168 and test contacts 192 to slide laterally along the surfaces 128 and 129, and the beveled portions 131 and 133 automatically receive and center the solder balls 168 relative to the test contacts 192. Moreover, this feature aligns and corrects test contacts 192 that are angled or otherwise inclined such that the contacts 192 are not perpendicular to the substrate 162. Another advantage of the beveled portions 131 and 133 of the individual apertures 130 is that the lack of sharp edges reduces the likelihood that the solder balls 168 will be damaged, deformed, or detached from the substrate 162.

D. Additional Embodiments of Test Sockets

Figure 4:
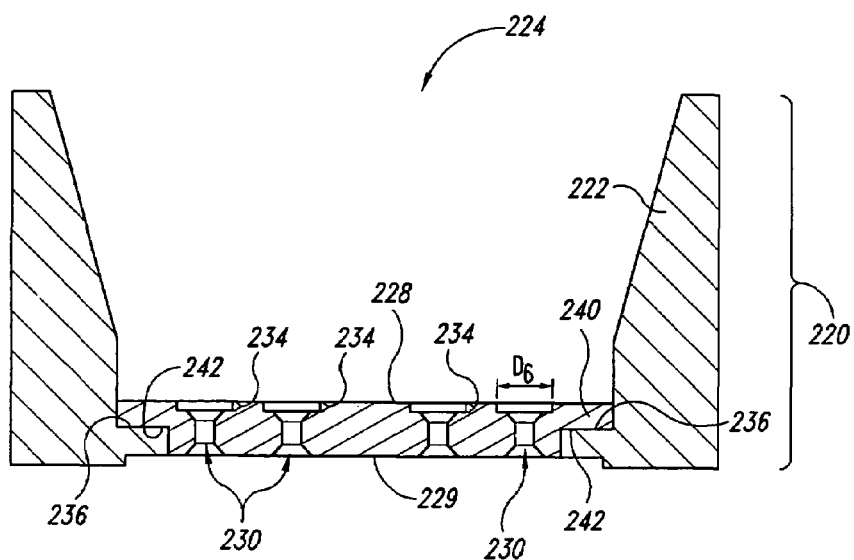
FIG. 4 is a schematic side cross-sectional view of a test socket including a body and a ball support member carried by the body in accordance with another embodiment of the invention.

FIG. 4 is a schematic side cross-sectional view of a test socket 220 including a body 222 and a ball support member 240 carried by the body 222 in accordance with another embodiment of the invention. The illustrated body 222 includes a recess 224 and a shelf 236 that projects into the recess 224 proximate to the base of the body 222. The illustrated ball support member 240 includes a referencing feature 242 for contacting the shelf 236 and positioning the support member 240 relative to the body 222. In other embodiments, the ball support member 240 may not have the referencing feature 242 but rather can be a generally flat support member carried by the shelf 236.

The illustrated ball support member 240 further includes a support surface 228, an exterior surface 229 opposite the support surface 228, and a plurality of apertures 230 extending through the support member 240 from the support surface 228 to the exterior surface 229. The apertures 230 are generally similar to the apertures 130 described above with reference to FIG. 3B, except the illustrated apertures 230 further include a cylindrical portion 234 proximate to the support surface 228. The cylindrical portion 234 can have a diameter $D_6$ greater than the diameter $D_4$ of the solder balls 168 (FIG. 3B) and a depth $T_1$ less than the diameter $D_4$ of the solder balls 168 so that when the microfeature device 160 (FIG. 3B) is received in the recess 224, the substrate 162 (FIG. 3B) will be spaced apart from the support surface 228.

One feature of the illustrated test socket 220 is that the ball support member 240 can be retrofit onto existing test sockets, such as the socket 20 illustrated in FIG. 1, to space the microfeature devices apart from the shelf 236. An advantage of this feature is that several of the drawbacks of conventional test sockets described above in the Background can be overcome by using the ball support member 240 in conjunction with the conventional test sockets.

Figure 5A:
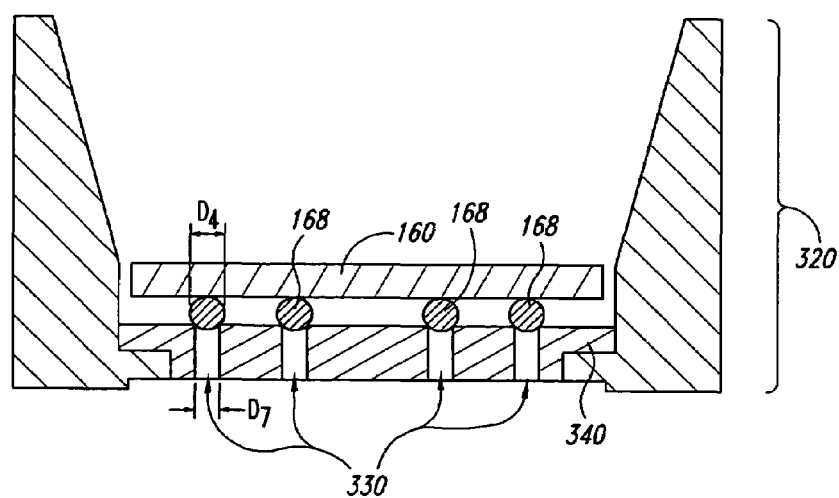
FIGS. 5A-5C illustrate test sockets having various aperture configurations in accordance with additional embodiments of the invention.
Figure 5B:
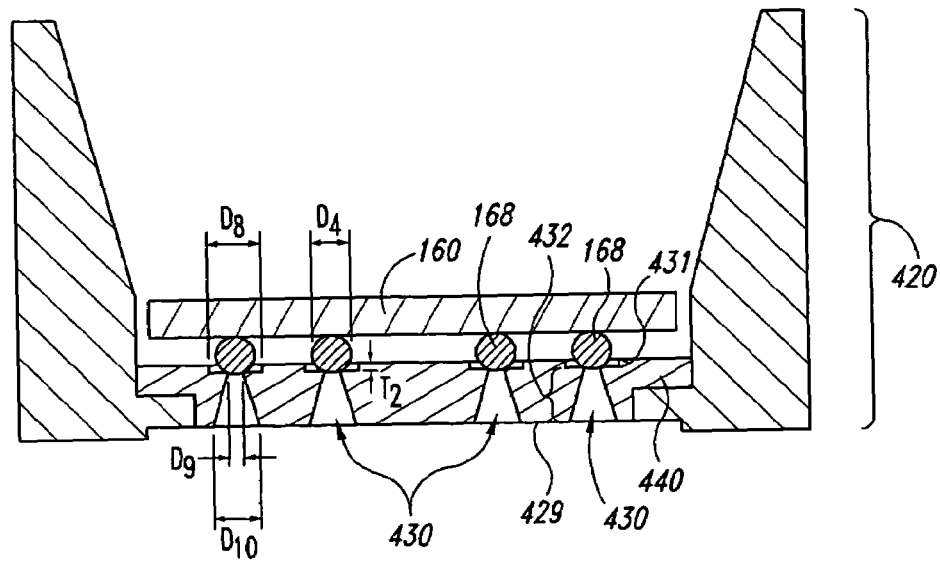
Figure 5C:
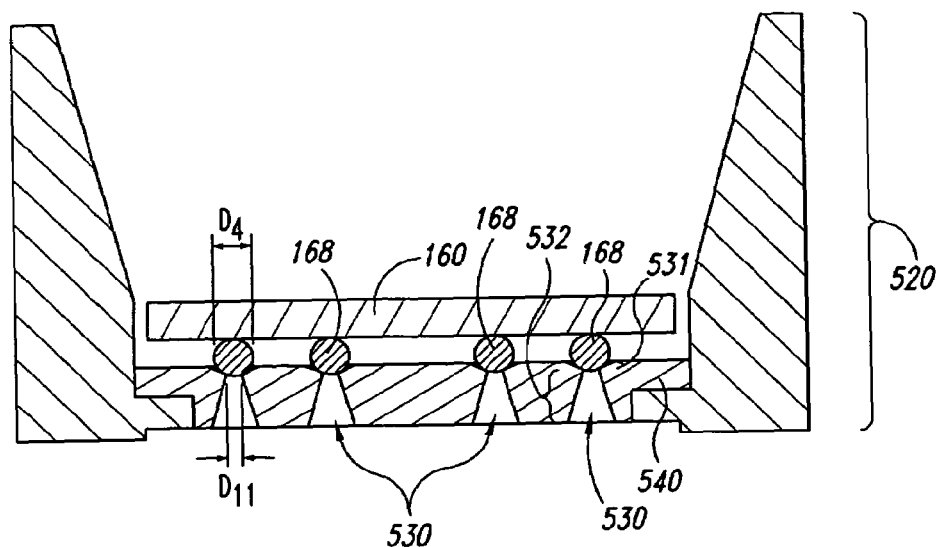

FIGS. 5A-5C illustrate test sockets having various aperture configurations in accordance with additional embodiments of the invention. Although the test sockets illustrated in FIGS. 5A-5C include ball support members, other test sockets without separate ball support members, such as the test socket illustrated in FIG. 3B, can have similar aperture configurations. For example, FIG. 5A is a schematic side cross-sectional view of a test socket 320 having a ball support member 340 with a plurality of cylindrical apertures 330. The individual apertures 330 extend through the ball support member 340 and have a diameter $D_7$ less than the diameter $D_4$ of the solder ball 168 so that only a portion of a corresponding solder ball 168 is received within the individual apertures 330.

FIG. 5B is a schematic side cross-sectional view of a test socket 420 having a ball support member 440 with a plurality of apertures 430 in accordance with another embodiment of the invention. The individual apertures 430 include a first cylindrical portion 431 having a diameter $D_8$ greater than the diameter $D_4$ of the corresponding solder balls 168 and a depth $T_2$ less than the diameter $D_4$ of the corresponding solder balls 168. The individual apertures 430 also include a frusto-conical second portion 432 having a first diameter $D_9$ proximate to the first portion 431 and a second diameter $D_{10}$ proximate to an exterior surface 429. The first diameter $D_9$ is less than the diameter $D_4$ of the corresponding solder ball 168 so that only a portion of the corresponding solder ball 168 is received within the individual apertures 430.

FIG. 5C is a schematic side cross-sectional view of a test socket 520 having a ball support member 540 with a plurality of apertures 530 in accordance with another embodiment of the invention. The individual apertures 530 include a beveled first portion 531 and a frusto-conical second portion 532. The junction between the first and second portions 531 and 532 has a diameter $D_{11}$ less than the diameter $D_4$ of the corresponding solder ball 168 so that only a portion of the solder balls 168 is received within the individual apertures 530. In additional embodiments, the apertures can have other configurations.

Figure 6A:
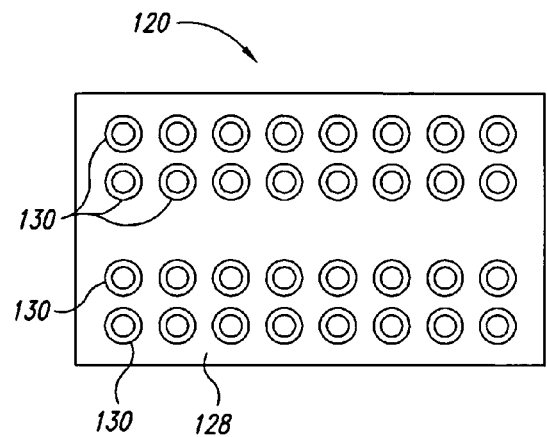
FIGS. 6A-6C illustrate various arrangements of apertures in a support surface in accordance with different embodiments of the invention.
Figure 6B:
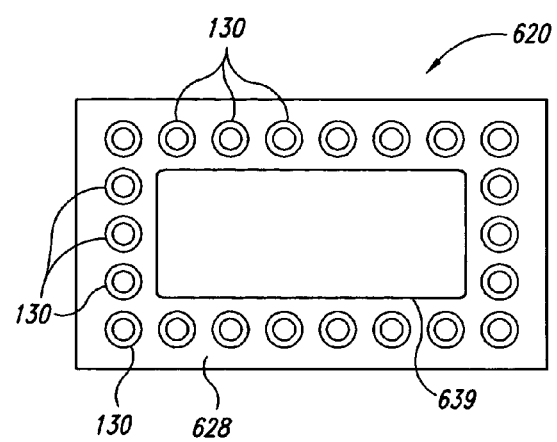
Figure 6C:
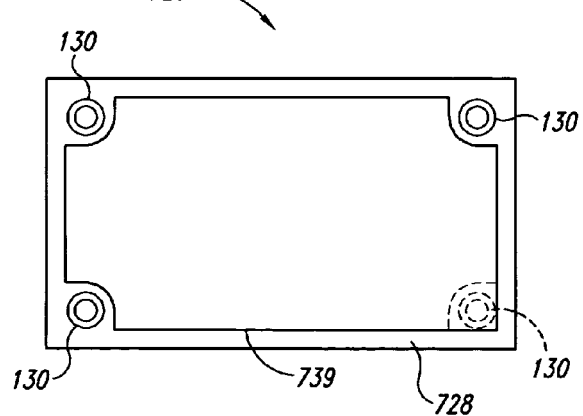

FIGS. 6A-6C illustrate various arrangements of apertures in a support surface in accordance with different embodiments of the invention. For example, FIG. 6A is a top plan view of the support surface 128 of the test socket 120 illustrated in FIGS. 3A and 3B. In this embodiment, the array of apertures 130 is arranged in rows and columns extending across the support surface 128 such that the support surface 128 has a corresponding aperture 130 for each solder ball on the microfeature device. In other embodiments, such as those described below with reference to FIGS. 6B and 6C, the number of apertures in the support surface may not be equal to the number of solder balls on the microfeature device.

FIG. 6B is a top plan view of a support surface 628 of a test socket 620 in accordance with another embodiment of the invention. The illustrated support surface 628 includes an opening 639 extending through the test socket 620 and a plurality of apertures 130 surrounding the opening 639. In this arrangement, the number of apertures 130 may be less than the number of solder balls on the microfeature device. Accordingly, when the microfeature device is received in the test socket 620, the solder balls at the perimeter region of the device are partially received in corresponding apertures 130 and the other solder balls are received in the opening 639 of the support surface 628.

An advantage of the test socket 620 illustrated in FIG. 6B is that the opening 639 allows debris to fall through the test socket 620 rather than accumulate across the support surface 628 where it could interfere with the microfeature device. Another advantage of the illustrated test socket 620 is that fewer solder balls are placed in corresponding apertures 130 during testing, which reduces the likelihood that the support surface 628 will damage, deform, or detach solder balls from the microfeature device.

FIG. 6C is a top plan view of a test socket 720 having a support surface 728 in accordance with another embodiment of the invention. The illustrated support surface 728 includes an opening 739 extending through the test socket 720 and three apertures 130 at different corners of the surface 728. The apertures 130 are positioned to receive corresponding solder balls of a microfeature device. In other embodiments, the support surface 728 can include fourth aperture 130 (shown in broken lines) at the remaining corner. In additional embodiments, support surfaces can have other arrangements of apertures.

From the foregoing, it will be appreciated that specific embodiments of the invention have been described herein for purposes of illustration, but that various modifications may be made without deviating from the spirit and scope of the invention. For example, many of the elements of one embodiment can be combined with the other embodiments in addition to or in lieu of the elements of the other embodiments. Accordingly, the invention is not limited except as by the appended claims.

We claim:

1. A test socket for receiving a microfeature device having a substrate and a plurality of interconnect elements projecting from the substrate, the test socket comprising a recess having a lead-in surface and a support surface, the support surface including a plurality of open apertures positioned to receive corresponding interconnect elements of the microfeature device, wherein the individual open apertures extend through the test socket and have a cross-sectional dimension less than a cross-sectional dimension of the interconnect elements so that the substrate is spaced apart from the support surface when the microfeature device is received in the recess, and wherein at least a section of the support surface positioned to contact at least one of the interconnect elements is dielectric.

2. The test socket of claim 1 wherein the apertures in the support surface are arranged in rows and columns corresponding to an array of interconnect elements on the microfeature device.

3. The test socket of claim 1 wherein:
the support surface further comprises an opening; and
the apertures in the support surface are arranged around the perimeter of the opening so that when the microfeature device is received in the recess, the apertures receive the corresponding interconnect elements and the other interconnect elements are positioned at the opening.

4. The test socket of claim 1 wherein:
the support surface further comprises an opening; and
the apertures comprise at least three apertures around the opening.

5. The test socket of claim 1 wherein the cross-sectional dimension of the individual apertures is from approximately 70 percent to approximately 80 percent of the cross-sectional dimension of the corresponding interconnect elements.

6. The test socket of claim 1, further comprising:
a body having the recess and a shelf; and
a ball support member carried by the shelf and having the support surface.

7. The test socket of claim 1 wherein the individual apertures comprise a beveled portion.

8. A test socket for receiving a microfeature device having a substrate and a plurality of interconnect elements projecting from the substrate, the test socket comprising a recess having a lead-in surface and a support surface, the support surface including a plurality of apertures positioned to receive corresponding interconnect elements of the microfeature device, wherein the individual apertures extend through the test socket and have a cross-sectional dimension less than a cross-sectional dimension of the interconnect elements so that the substrate is spaced apart from the support surface when the micro feature device is received in the recess, wherein the test socket further comprises an exterior surface opposite the support surface, and wherein the individual apertures comprise a first beveled portion proximate to the support surface and a second beveled portion proximate to the exterior surface.

9. The test socket of claim 1 wherein:
the cross-sectional dimension of the individual apertures is a first, smallest diameter in the apertures; and
the individual apertures comprise a first portion having the first, smallest diameter and a second portion having a second diameter greater than the first diameter.

10. A test socket for receiving a microfeature device having a substrate and a plurality of interconnect elements projecting from the substrate, the test socket comprising a support surface and a plurality of open apertures in the support surface configured to receive corresponding interconnect elements of the microfeature device, wherein individual open apertures extend through the test socket and are configured to receive only a distal portion of a corresponding interconnect element so that the substrate is spaced apart from the support surface when the microfeature device is received in the test socket, and wherein at least a section of the support surface positioned to contact at least one of the interconnect elements is dielectric.

11. The test socket of claim 10 wherein the individual apertures have a cross-sectional dimension less than a cross-sectional dimension of the corresponding interconnect element.

12. The test socket of claim 10 wherein the individual apertures comprise a first portion having a first cross-sectional dimension and a second portion having a second cross-sectional dimension greater than the first cross-sectional dimension.

13. The test socket of claim 10 wherein the apertures in the support surface are arranged in rows and columns corresponding to an array of interconnect elements on the microfeature device.

14. The test socket of claim 10 wherein:
the support surface further comprises an opening; and
the apertures in the support surface are arranged around the perimeter of the opening so that when the microfeature device is received in the test socket, the apertures receive the corresponding interconnect elements and the other interconnect elements are positioned at the opening.

15. The test socket of claim 10, further comprising:
a body having a recess to receive the microfeature device and a shelf in the recess; and
a support member carried by the shelf and having the support surface.

16. A test socket for receiving a microfeature device having a substrate and a plurality of solder balls on the substrate, the test socket comprising:
a body including a recess, a lead-in surface partially defining the recess, and a shelf in the recess; and
a ball support member carried by the shelf, the ball support member including a plurality of open apertures positioned to receive corresponding solder balls of the microfeature device, wherein individual open apertures extend through the ball support member and are sized to receive a portion of a corresponding solder ball so that the substrate is spaced apart from the support surface when the microfeature device is received in the test socket.

17. The test socket of claim 16 wherein the individual apertures have a diameter less than a diameter of the corresponding solder ball.

18. The test socket of claim 16 wherein the individual apertures comprise a first portion having a first diameter and a second portion having a second diameter greater than the first diameter.

19. The test socket of claim 16 wherein the apertures in the ball support member are arranged in rows and columns corresponding to an array of solder balls on the microfeature device.

20. The test socket of claim 16 wherein:
the ball support member further comprises an opening; and
the apertures in the ball support member are arranged around the perimeter of the opening so that when the microfeature device is received in the test socket, the apertures receive the corresponding solder balls and the other solder balls are positioned at the opening.

21. A test socket for receiving a microfeature device having a substrate and an array of conductive balls on the substrate, the test socket comprising a support surface and a plurality of open apertures arranged in an array corresponding to the array of conductive balls of the microfeature device, wherein the individual open apertures extend through the test socket and have a first diameter at the support surface and a second diameter spaced apart from the support surface, wherein the second diameter is less than the first diameter such that the substrate is spaced apart from the support surface when the microfeature device is received in the test socket, wherein at least one of the first and second diameters is less than a diameter of the conductive balls, and wherein at least a section of the support surface positioned to contact at least one of the interconnect elements is dielectric.

* * * * *